(12) United States Patent
Mikulka et al.

(10) Patent No.: US 9,841,449 B2
(45) Date of Patent: Dec. 12, 2017

(54) APPARATUS AND METHOD FOR CABLE PHASE CORRECTION FOR VECTOR ANALYZER REMOTE HEADS

(71) Applicant: Keysight Technologies, Inc., Minneapolis, MN (US)

(72) Inventors: Michael Mikulka, Santa Rosa, CA (US); Richard Lynn Rhymes, Santa Rosa, CA (US); Hassan Tanbakuchi, Santa Rosa, CA (US); Chen-Yu Chi, Santa Rosa, CA (US); Kenneth H. Wong, Santa Rosa, CA (US); Thomas Zwick, Baden-Württemberg (DE)

(73) Assignee: Keysight Technologies, Inc., Santa Rosa, CA (US)

( * ) Notice: Subject to any disclaimer, the term of this patent is extended or adjusted under 35 U.S.C. 154(b) by 25 days.

(21) Appl. No.: 14/954,048

(22) Filed: Nov. 30, 2015

(65) Prior Publication Data

US 2017/0153280 A1 Jun. 1, 2017

(51) Int. Cl.
*G01R 27/04* (2006.01)
*G01R 27/28* (2006.01)
*G01R 35/00* (2006.01)

(52) U.S. Cl.
CPC ............ *G01R 27/28* (2013.01); *G01R 35/00* (2013.01)

(58) Field of Classification Search
CPC ........ G01R 27/02; G01R 27/28; G01R 27/06; G01R 27/04; G01R 27/32; G01R 35/005; G01R 11/36; G01R 11/185; G01R 11/40; G01R 11/20; G01R 11/52; G01R 31/02; G01R 31/2822

USPC ....... 324/650, 138, 637, 638, 605, 620, 622, 324/669, 684, 683, 76.52
See application file for complete search history.

(56) References Cited

U.S. PATENT DOCUMENTS

| | | | |
|---|---|---|---|
| 4,803,419 A | 2/1989 | Roos | |
| 4,839,578 A | 6/1989 | Roos | |
| 5,313,166 A * | 5/1994 | Eul | G01R 35/005 324/601 |
| 6,965,241 B1 | 11/2005 | Liu et al. | |

(Continued)

OTHER PUBLICATIONS

James C. Liu et al., "Test Port Cable Instability and VNA Measurement Errors," Microwave Measurement Conference (ARFTG), 2013 81st ARFTG, 2013, pp. 1-8.

(Continued)

*Primary Examiner* — Thang Le

(57) ABSTRACT

A system and method corrects the phase of measurement signals obtained from remote heads during testing of a device. A first signal is transmitted along first and second transmission lines to respective remote heads. A shunt switch is connected between a remote end of the first transmission line and a first remote head, and another shunt switch is connected between a remote end of the second transmission line and a second remote head. The shunt switches in a first configuration respectively reflect the first signal back to a phase measurement apparatus as first and second reflected signals. The phase measurement apparatus determines a first reference phase and a second reference phase respectively based on the first and second reflected signals. A compensation unit compensates phase of the measurement signals based on the first and second reference phases.

20 Claims, 11 Drawing Sheets

(56) References Cited

U.S. PATENT DOCUMENTS

| | | | | |
|---|---|---|---|---|
| 6,980,288 B2* | 12/2005 | Kido | ............... | G01M 11/338 |
| | | | | 356/73.1 |
| 7,561,987 B2* | 7/2009 | Nakayama | ........... | G01R 35/005 |
| | | | | 702/182 |
| 8,508,237 B2* | 8/2013 | Maestle | ................ | G01R 27/32 |
| | | | | 324/601 |
| 8,508,241 B2* | 8/2013 | Heuermann | ........... | G01R 27/32 |
| | | | | 324/637 |
| 2005/0030047 A1* | 2/2005 | Adamian | ............... | G01R 27/28 |
| | | | | 324/650 |
| 2011/0163762 A1* | 7/2011 | Marchetti | .......... | G01R 31/2822 |
| | | | | 324/615 |
| 2012/0161784 A1* | 6/2012 | Benedikt | ............ | G01R 31/2837 |
| | | | | 324/612 |

OTHER PUBLICATIONS

Faisal Mubarak et al., "A Method for De-Embedding Cable Flexure Errors in S-parameter Measurements," Microwave Measurement Conference (ARFTG), 2014 83rd ARFTG, 2014, pgs.

* cited by examiner

APPARATUS AND METHOD FOR CABLE PHASE CORRECTION FOR VECTOR ANALYZER REMOTE HEADS

BACKGROUND

S-parameters of a device-under-test (DUT) may be measured using remote reflectometer heads that are typically connected to a millimeter wave (mmw) vector network analyzer (VNA) by long, flexible coaxial cables that deliver local oscillator (LO) signals and radio frequency (RF) stimulus signals to the multipliers and mixers (down converters) inside the reflectometer heads. The difference in thermal and/or mechanically related phase change in the LO paths used for LO signal distribution between the VNA and the reflectometer heads is a primary contributor to S-parameter measurement instability.

In particular, the flexible high frequency coaxial cables are subject to movement during measurement after system calibration. The movement stresses the dielectric of the flexible coaxial cables, and physically changes the LO paths. The changes lead to impedance changes at points of stress, mainly causing a phase shift to the RF and LO signals reaching the remote reflectometer heads. The phase shift contributes to measurement errors.

In standard 2-port VNA setups, changes to the phases of the RF stimulus signals supplied to the reflectometer heads may not be critical to the accurate measurement of S-parameters. However, phase changes to an LO signal supplied to the respective reflectometer heads in a standard 2-port VNA setup directly leads to measurement instability of the S21 and S12 parameters, because the signal transmitted to and received from the DUT in the respective reflectometer heads will consequently be divided by respective different LO signals. The S11 and S22 parameters are not affected, since the DUT transmit and receive signals are divided in a same reflectometer head by the same LO signal.

Due to frequency multiplication in the reflectometer heads, the phase error imposed on the S-parameters is N-times higher than the phase error imposed on the signals transmitted through the coaxial cables feeding the reflectometer heads, where N is the frequency multiplication factor in the reflectometer heads. The instability issue becomes more severe towards higher frequencies. The amplitude changes induced on the signals transmitted through the coaxial cables due to the movement may have a rather negligible effect due to the limiting nature of the multiplication circuits in the reflectometer heads.

FIG. 1 illustrates a graph of the measured phase error after bending one LO cable of a 2-port VNA with reflectometer heads covering the F-band (90-140 GHz). In multiport VNAs, the LO path phase change problem will occur for any S-parameter measurement in which transmit and receive signals are measured in different heads. In addition to the above described problem with the LO path phase change, in the case of differential setups, phase shifts in RF cables can lead to instability since the RF stimulus phase must be controlled to ensure a known and controllable phase difference between the two signals forming a differential port.

What is needed is cost efficient way of measuring LO path changes and tracking the contribution of the LO path changes to measurement instability, so that the resulting measured change may be applied to update the calibration and remove the effect of the phase change from S-parameter measurements.

SUMMARY

Embodiments of the inventive concept provide a system including a phase measurement apparatus configured to transmit a first signal along first and second transmission lines to respective first and second remote heads connectable to a device; a first shunt switch connected between a remote end of the first transmission line and the first remote head; and a second shunt switch connected between a remote end of the second transmission line and the second remote head. The first and second shunt switches respectively reflect the first signal back to the phase measurement apparatus as first and second reflected signals in a first configuration, and pass the first signal to the first and second remote heads in a second configuration during testing of the device. The phase measurement apparatus is further configured to determine a first reference phase based on the first reflected signal and a second reference phase based on the second reflected signal. The system further includes a phase compensation unit configured to compensate phase of measurement signals obtained during testing of the device based on the first and second reference phases.

Embodiments of the inventive concept also provide a method of correcting phase change of measurement signals obtained from remote heads during testing of a device. The method includes inserting a first reflection between a remote end of a first transmission line and a first remote head, and a second reflection between a remote end of a second transmission line and a second remote head; transmitting a first signal along the first and second transmission lines toward the respective first and second reflections; determining a first reference phase and a second reference phase using a phase measurement apparatus, respectively based on a first on a first reflected signal and a second reflected signal reflected by the first and second reflections responsive to the first signal; thereafter, connecting the first and second remote heads to the device; and compensating phase of measurement signals obtained during testing of the device, based on the first and second reference phases.

BRIEF DESCRIPTION OF THE DRAWINGS

The illustrative embodiments are best understood from the following detailed description when read with the accompanying drawing figures. Wherever applicable and practical, like reference numerals refer to like elements.

DETAILED DESCRIPTION

Figure 1:
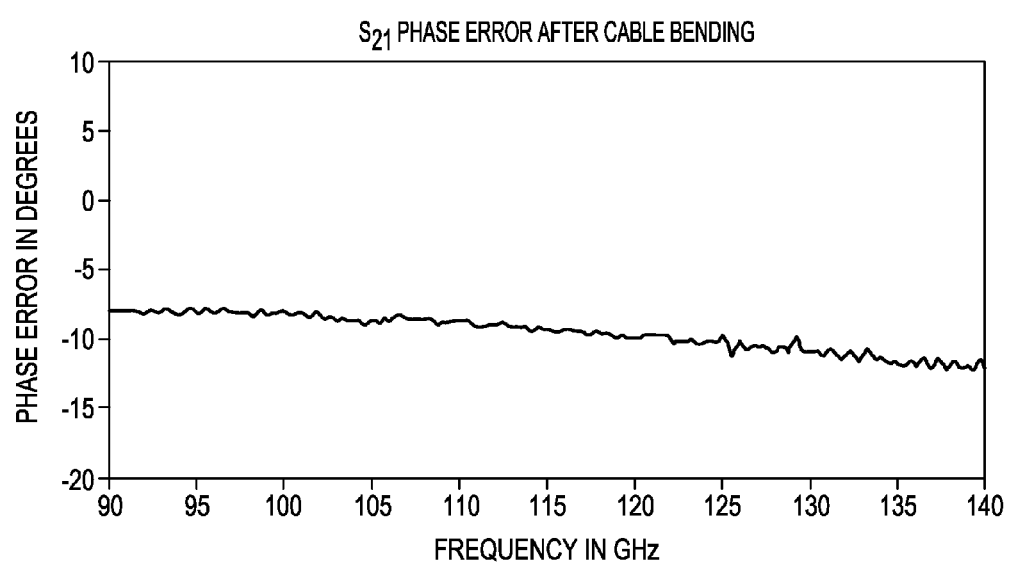
FIG. 1 illustrates a graph of the measured phase error after bending one LO cable of a 2-port VNA with reflectometer heads covering the F-band (90-140 GHz).

Embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the inventive concept to one of ordinary skill in the art. Accordingly, known processes, elements, and techniques are not described with respect to some of the embodiments. In the drawings, the size and relative sizes of layers and regions may be exaggerated for clarity. Unless otherwise noted, like reference numerals denote like elements throughout the attached drawings and written description, and thus descriptions may not be repeated.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It should be further understood that the terms "comprises" and/or "comprising," or "includes" and/or "including" when used in this specification, specify the presence of stated features, regions, integers, steps, operations, elements, components and/or groups, but do not preclude the presence or addition of one or more other features, regions, integers, steps, operations, elements, components, and/or groups thereof. The term "exemplary" is intended to refer to an example or illustration.

Unless otherwise defined, all terms (including technical and scientific terms) used herein have the same meaning as commonly understood by one of ordinary skill in the art to which this inventive concept belongs. It should be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As used in the specification and appended claims, and in addition to their ordinary meanings, the terms "substantial" or "substantially" mean to within acceptable limits or degree. For example, "substantially canceled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Figure 2:
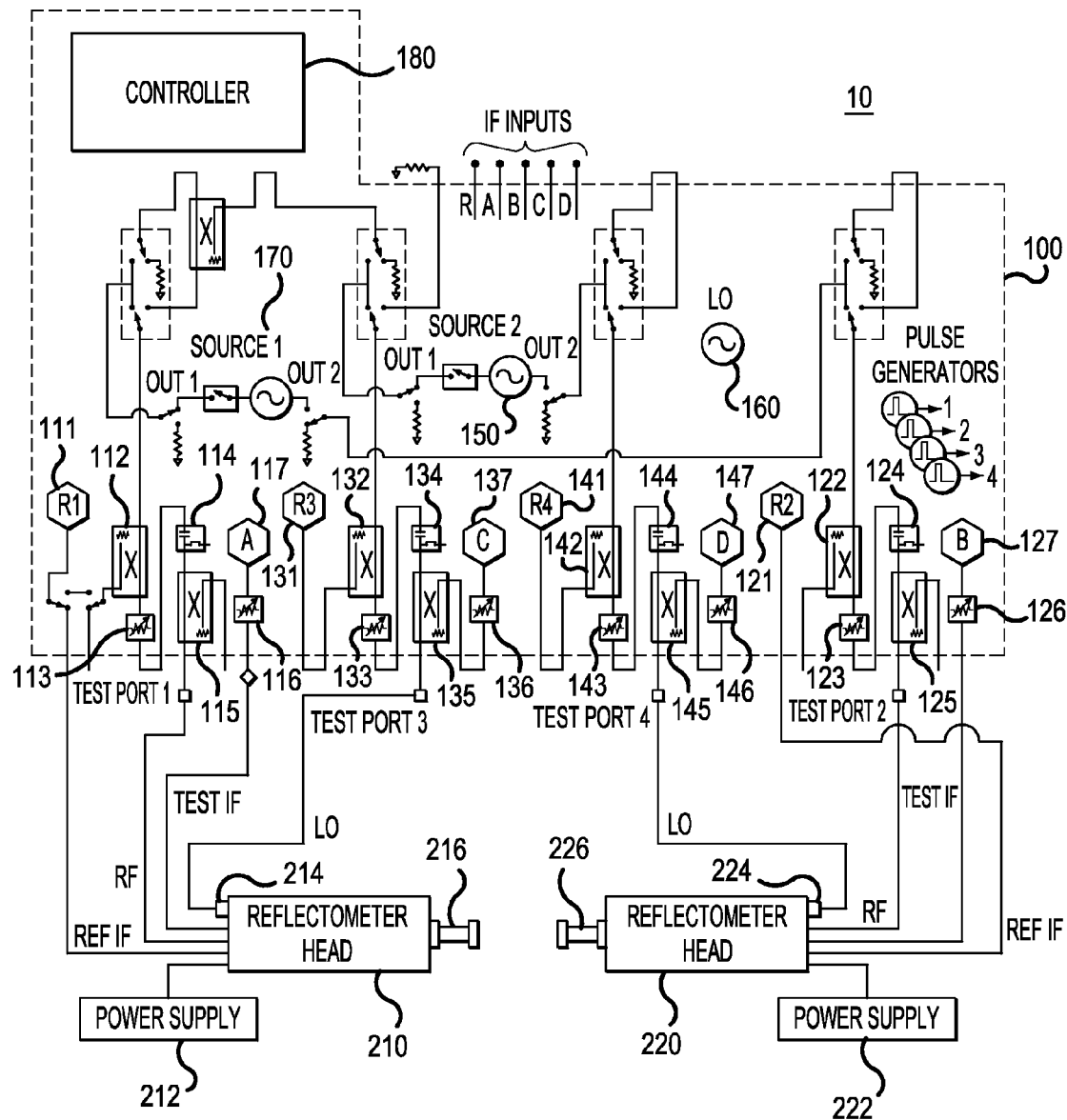
FIG. 2 illustrates a block diagram of a system that corrects phase change induced on signals transmitted over transmission lines, including 4-port vector network analyzer (VNA) with remote millimeter (MMW) reflectometer heads, according to an embodiment of the inventive concept.

FIG. 2 illustrates a block diagram of system 10 that corrects phase change induced on signals transmitted over transmission lines, including 4-port vector network analyzer (VNA) 100 with millimeter (mmw) reflectometer heads 210 and 220 (which may hereinafter be referred to as reflectometer heads), according to an embodiment of the inventive concept.

VNA 100 as shown in FIG. 2 is a 4-port VNA configured to include first through fourth reflectometers connected to reflectometer head (first remote head) 210 and reflectometer head (second remote head) 220 via flexible coaxial cables. In FIG. 2, at least four respective coaxial cables are disposed between VNA 100 and a corresponding reflectometer head. The coaxial cables respectively provide signal paths for an LO signal, an RF signal, a TEST IF signal and an REF IF signal. In detail, a first reflectometer within VNA 100 connected to test port 1 is configured as including receiver 111, directional coupler 112, attenuator 113, bias tee 114, directional coupler 115, attenuator 116 and receiver 117. A second reflectometer within VNA 100 connected to test port 2 is configured as including receiver 121, directional coupler 122, attenuator 123, bias tee 124, directional coupler 125, attenuator 126 and receiver 127. A third reflectometer within VNA 100 connected to test port 3 is configured as including receiver 131, directional coupler 132, attenuator 133, bias tee 134, directional coupler 135, attenuator 136 and receiver 137. A fourth reflectometer within VNA 100 connected to test port 4 is configured as including receiver 141, directional coupler 142, attenuator 143, bias tee 144, directional coupler 145, attenuator 146 and receiver 147. It should however be understood that in other embodiments of the inventive concept, the aforementioned reflectometers in VNA 100 may be configured differently, may include additional components and/or may include fewer components than as shown and described with respect to FIG. 2.

VNA 100 further includes among other components LO source 150, LO source 160, and RF source 170. LO source 150 is configured to output a millimeter wave (mmw) signal within a frequency range of about 30 GHz to 1 THz as a common local oscillator (LO) signal to reflectometer heads 210 and 220 through respective test ports 3 and 4 via the aforementioned third and fourth reflectometers. LO source 160 is configured to output a local oscillator (LO) signal within a frequency range of about 2 GHz to 26 GHz that is connected to heterodyne receivers 111, 117, 121, 127, 131, 137, 141 and 147 via interconnections (not shown) that are internal to VNA 100. In some embodiments, receivers 111, 117, 121 and 127 may act as IF down-converters and digitizers for millimeter wave (mmw) remote heads that may be connected to VNA 100, and receivers 131 and 141 for example may act microwave (mw) down-converters for LO source 150. The millimeter wave down-conversion takes place inside the mmw remote heads and receivers 111, 117, 121 and 127 are only used as IF down-converter and digitizers for the millimeter wave operation. RF source 170 is configured to output a common RF signal within a frequency range of about 2 GHz to 26 GHz to reflectometer heads 210 and 220 through respective test ports 1 and 2 via the aforementioned first and second reflectometers. It should be understood that the above noted frequency ranges are examples, and that in other embodiments of the inventive concept various different frequency ranges may be used.

VNA 100 further includes controller 180 that is connected to various components and circuits within VNA 100 via interconnections (not shown) that are internal to VNA 100. Controller 180 may be configured to be responsive to user selection to generate various control signals that control the various components and circuits within VNA 100, and may perform various process operations.

Controller 180 as shown in FIG. 2 may be constructed of any combination of hardware (electronic, e.g., phase locked loop), firmware or software architectures. Controller 180 may be implemented by an application specific integrated circuit (ASIC) or part of an ASIC, or by a field programmable gate array (FPGA) or part of an FPGA. Controller 180 may include its own memory (e.g., nonvolatile memory) for storing executable software/firmware code that allows it to perform various control and process operations. Alternatively, the executable code may be stored in designated memory locations within a separate memory (not shown). The memory may be any number, type and combination of external and internal nonvolatile read only memory (ROM) and volatile random access memory (RAM), and may store various types of information, such as signals and/or computer programs and software algorithms executable by controller 180. The memory may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, or the like.

System 10 as shown in FIG. 2 further includes power supply 212 and power supply 222 that respectively provide operational power to first and second reflectometer heads 210 and 220. Reflectometer heads 210 and 220 respectively include test ports 216 and 226 that may be connectable to a device-under-test (DUT). The DUT (not shown) may be a passive device such as a filter for example, an active device such as a transistor for example, or any of various components to be tested.

During testing of a DUT (device), LO source 150 of VNA 100 may be configured to output the microwave signal as a common LO signal to directional coupler 132 of the third reflectometer and to directional coupler 142 of the fourth reflectometer. A portion of the LO signal is coupled by directional coupler 132 to receiver 131, while the remainder of the LO signal is passed by directional coupler 132 through attenuator 133 and bias tee 134 to directional coupler 135 which outputs the LO signal via test port 3 and the LO path of a corresponding coaxial cable to reflectometer head 210. Similarly, a portion of the LO signal is coupled by directional coupler 142 to receiver 141, while the remainder of the LO signal is passed by directional coupler 142 through attenuator 143 and bias tee 144 to directional coupler 145 which outputs the LO signal via test port 4 and the LO path of a corresponding coaxial cable to reflectometer head 220. RF source 170 of VNA 100 may be configured to output a common RF signal to directional coupler 112 of the first reflectometer and to directional coupler 122 of the second reflectometer. Directional coupler 112 passes the RF signal through attenuator 113 and bias tee 114 to directional coupler 115 which outputs the RF signal via test port 1 and the RF path of a corresponding coaxial cable to reflectometer head 210. Similarly, directional coupler 122 passes the RF signal through attenuator 123 and bias tee 124 to directional coupler 125 which outputs the RF signal via test port 2 and the RF path of a corresponding coaxial cable to reflectometer head 220.

In embodiments of the inventive concept, reflectometer heads 210 and 220 may be configured as frequency extenders operable at about 30 GHz to 1 THz for example, and may include various multipliers and mixers (not shown). Reflectometer head 210 may be configured to multiply both the RF signal (RF) and the LO signal (LO) respectively provided from VNA 100 via test ports 1 and 3 into the desired frequency range of about 200 GHz, to output the multiplied RF signal to the DUT via test port 216, to mix the multiplied LO signal with the multiplied RF signal to provide and output a corresponding reference IF signal (REF IF) back to receiver 111 of VNA 100 via a corresponding coaxial cable, and to mix the corresponding signal provided from the DUT through test port 216 with the multiplied LO signal to provide a down-converted signal as the test IF signal (TEST IF) back to receiver 117 via a corresponding coaxial cable. Reflectometer head 220 may be configured in a similar manner with respect to the RF signal (RF) and the LO signal (LO) respectively provided from VNA 100 via test ports 2 and 4, to provide the corresponding reference IF signal and test IF signal back to VNA 100. The corresponding reference IF signal and test IF signal returned from reflectometer head 210 as shown in FIG. 2 are respectively down-converted by receivers 111 and 117 within VNA 100, and the corresponding reference IF signal and test IF signal returned from reflectometer head 220 are respectively down-converted by receivers 121 and 127 within VNA 100. The down-converted signals from receivers 111, 117, 121 and 127 are provided to controller 180 which may be configured to determine the S-parameters of the DUT responsive to the signals from receivers 111, 117, 121 and 127.

System 10 of the inventive concept further includes shunt switch 214 (first shunt switch) and shunt switch 224 (second shunt switch), as shown in FIG. 2. Shunt switch 214 is connected between reflectometer head (first remote head) 210 and a remote end of the corresponding coaxial cable (first transmission line) that provides the LO signal path from test port 3. Shunt switch 224 is connected between reflectometer head (second remote head) 220 and a remote end of the corresponding coaxial cable (second transmission line) that provides the LO signal path from test port 4. As shown in FIG. 2, shunt switches 214 and 224 are disposed at the respective ends of the corresponding coaxial cables externally of the reflectometer heads 210 and 220. In some embodiments of the inventive concept, shunt switches 214 and 224 may be disposed within respective reflectometer heads 210 and 220.

As will be described subsequently in greater detail, in a first configuration, shunt switches 214 and 224 respectively reflect the LO signal (first signal) back to VNA 100 (test set) as first and second reflected signals. In a second configuration shunt switches 214 and 224 respectively pass the LO signal (first signal) to the reflectometer heads 210 and 220 during testing of the DUT. In the first configuration shunt switch 214 inserts a reflection (first reflection) between the remote end of the corresponding coaxial cable (first transmission line) that provides the LO signal path and reflectometer head 210. In the first configuration shunt switch 224 inserts a reflection (second reflection) between the remote end of the corresponding coaxial cable (second transmission line) that provides the LO signal path and reflectometer head 220.

Controller 180 may be configured to provide respective switching signals to control switching of shunt switches 214 and 224 into the first and second configurations. The switching signals may be output to shunt switches 214 and 224 from VNA 100 via respective wires, cables or signal paths (not shown).

Figure 3:
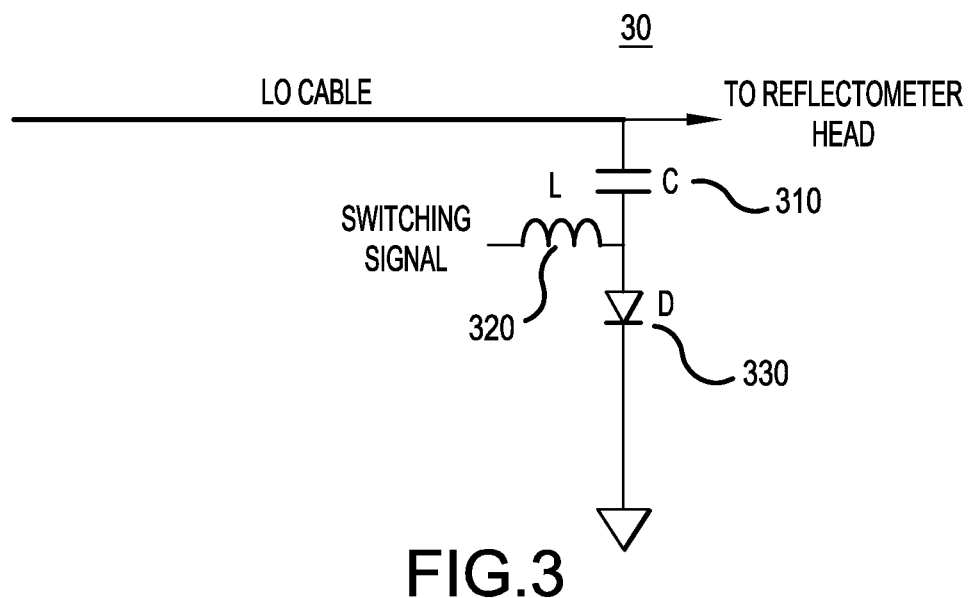
FIG. 3 illustrates a block diagram of a shunt switch, according to an embodiment of the inventive concept.

FIG. 3 illustrates a block diagram of a shunt switch 30, according to an embodiment of the inventive concept. Shunt switches 214 and 224 in FIG. 2 may be configured as shown in FIG. 3. Referring to FIG. 3, shunt switch 30 includes capacitor 310, inductor 320 and diode 330. Capacitor 310 includes a first terminal connected to the remote end of the coaxial cable that provides the LO signal path (first or second transmission lines). Diode 330 includes an anode connected to a second terminal of capacitor 310 and a cathode connected to ground. Inductor 320 includes a first terminal connected to a switching signal and a second terminal connected to the anode of diode 330. Shunt switch 30 may be controlled by the switching signal which acts as a diode bias to forward bias diode 330 and effectively ground the remote end of the coaxial cable that provides the LO signal path in the first configuration, thus inserting a reflection between the remote end and the reflectometer head. In the second configuration, shunt switch 30 may be controlled by the switching signal to reverse bias diode 330 and effectively cut-off the remote end of the coaxial cable that provides the LO signal path from ground, thus passing the LO signal (first signal) to the reflectometer head during testing of the DUT.

Figure 4:
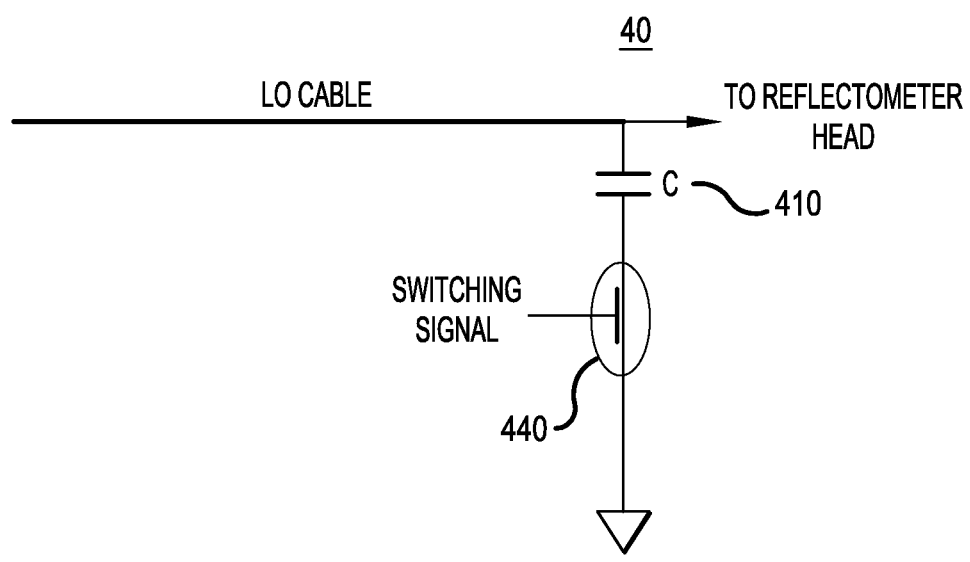
FIG. 4 illustrates a block diagram of a shunt switch, according to another embodiment of the inventive concept.

FIG. 4 illustrates a block diagram of a shunt switch 40, according to another embodiment of the inventive concept. Shunt switches 214 and 224 in FIG. 2 may configured as shown in FIG. 4. Referring to FIG. 4, shunt switch 40 includes capacitor 410 and field effect transistor (FET) 440. Capacitor 410 includes a first terminal connected to the remote end of the coaxial cable that provides the LO signal path (first or second transmission lines). FET 440 includes a first terminal connected to a second terminal of capacitor 410, a second terminal connected to ground, and a gate terminal connected to a switching signal. Shunt switch 40 may be controlled by the switching signal which acts as a FET bias to turn on FET 440 and effectively ground the remote end of the coaxial cable that provides the LO signal path in the first configuration, thus inserting a reflection between the remote end and the reflectometer head. In the second configuration, shunt switch 40 may be controlled by the switching signal to turn off FET 440 and effectively cut-off the remote end of the coaxial cable that provides the LO signal path from ground, thus passing the LO signal (first signal) to the reflectometer head during testing of the DUT.

Figure 5:
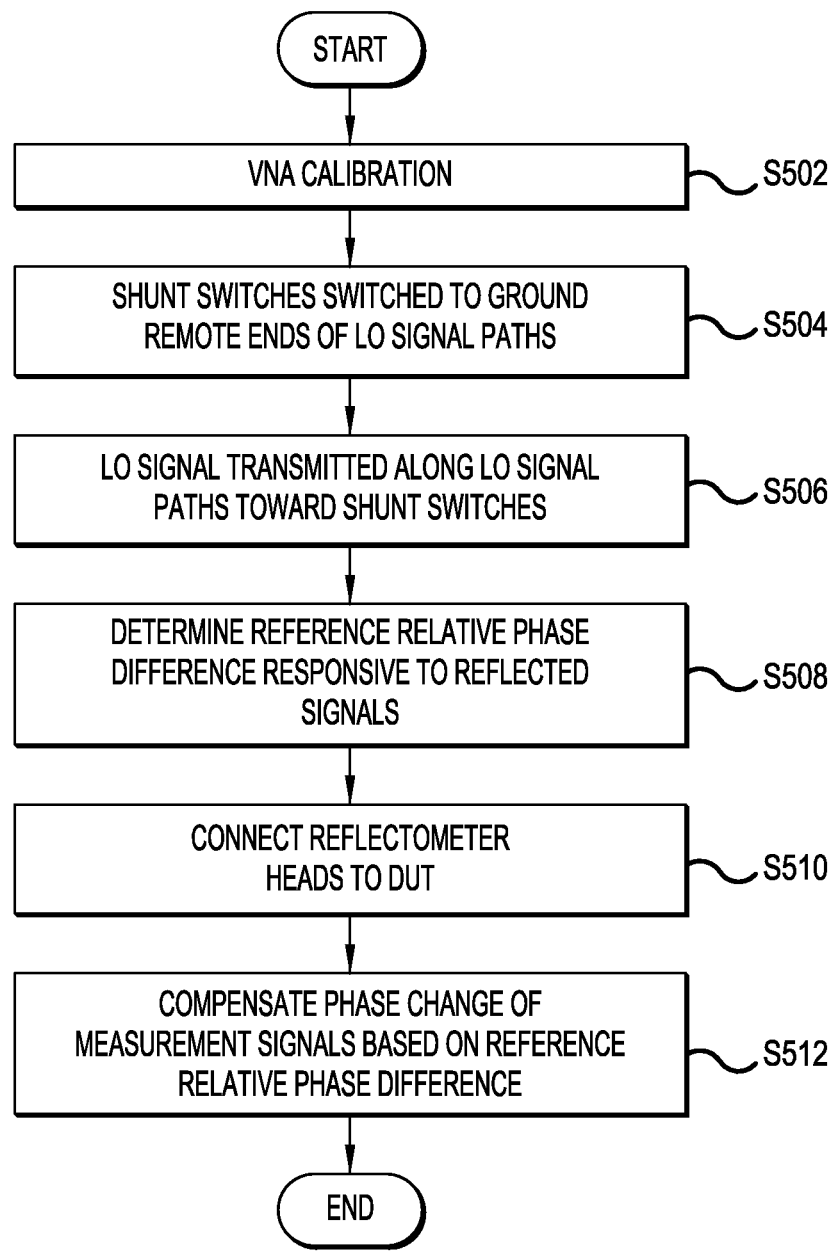
FIG. 5 illustrates a flow chart of a method of correcting phase change induced on signals within transmission lines between a VNA and reflectometer heads such as shown in FIG. 2, according to an embodiment of the inventive concept.

FIG. 5 illustrates a flow chart of a method of correcting phase change induced on signals within transmission lines between VNA 100 and reflectometer heads 210 and 220 such as shown in FIG. 2, according to an embodiment of the inventive concept. Controller 180 of VNA 100 may be configured to provide the necessary control and/or switching signals (not shown) to perform the method described with respect to FIG. 5. Controller 180 may provide the control and/or switching signals responsive to user input, software, firmware, or a combination thereof.

Referring to FIGS. 2 and 5, VNA 100 is calibrated in step S502 by applying calibration standards such as a short, an open and a load to each of test port 1, test port 2, test port 3 and test port 4. Controller 180 may be configured to measure the return signals from each of the standards, and according to any of various known techniques may create a model that may be applied to subsequent measurements to correct for any hardware or other inaccuracies in VNA 100.

As described previously, a primary contributor to S-parameter measurement instability is thermal or mechanically reflected phase change or drift in LO signal paths which occur over time and which change the LO signals provided to the respective reflectometer heads. Such change or drift of the LO signals may result in inaccuracy of the measurement signals obtained during testing. After VNA calibration in step S502, shunt switches 214 and 224 are switched in step S504 to the first configuration, to effectively ground the remote ends of the coaxial cables that respectively provide the LO signal paths from test ports 3 and 4 of VNA 100. That is, shunt switches 214 and 224 respectively insert reflections between the reflectometer heads 210 and 220 and the remote ends of the coaxial cables (first and second transmission lines) that provide the LO signal paths.

In step S506, the LO signal (first signal) generated by LO source 150 is provided through the corresponding aforementioned reflectometers to test ports 3 and 4, and are transmitted along the respective coaxial cables that provide the LO signal paths (first and second transmission lines) toward the shunt switches 214 and 224 that have been switched in step S504 to the first configuration to effectively ground the remote ends of the coaxial cables. Shunt switches 214 and 224 thus respectively return a first reflected signal and a second reflected signal back to the VNA 100 responsive to the transmitted LO signal (first signal).

In step S508, controller 180 of VNA 100 is configured to determine a first reference phase of the first reflected signal provided from receiver 137, and also a second reference phase of the second reflected signal provided from receiver 147. In particular, the first reflected signal from shunt switch 214 is provided via test port 3 through directional coupler 135 and attenuator 136 to receiver 137, and the second reflected signal is provided via test port 4 through directional coupler 145 and attenuator 146 to receiver 147. The first and second reflected signals are respectively down-converted by receivers 137 and 147, and the respective down-converted signals are provided to controller 180. Controller 180 may be configured to determine and subsequently store the first and second reference phases in memory within controller 180 or memory separate from controller 180. Steps S504 through steps S508 are performed prior to connecting reflectometer heads 210 and 220 to the DUT, and during steps S504 through steps S508 the corresponding coaxial cables providing the LO signal paths are positioned substantially without bends or kinks, and substantially without being moved.

Thereafter in step S510, reflectometer heads 210 and 220 are connected to the DUT. The coaxial cables connected to reflectometer heads 210 and 220 are moved in the process, changing the LO signal path length.

In step S512, controller 180 of VNA 100 is configured to compensate the phase of measurement signals obtained during testing of the DUT and subsequently transmitted over the coaxial cables during testing of the DUT. For example, controller 180 may compensate the phase of the reference IF signals and test IF signals returned from reflectometer heads 210 and 220 during testing of the DUT, based on the first and second reference phases determined in step S508. That is, controller 180 compensates the phase of the reference IF signal and test IF signal provided by reflectometer head 210 based on the first reference phase, and compensates the phase change of the reference IF signal and test IF signal provided by reflectometer head 220 based on the second reference phase. Controller 180 may be characterized as including a phase compensator or compensation unit that compensates the phase.

Figure 6:
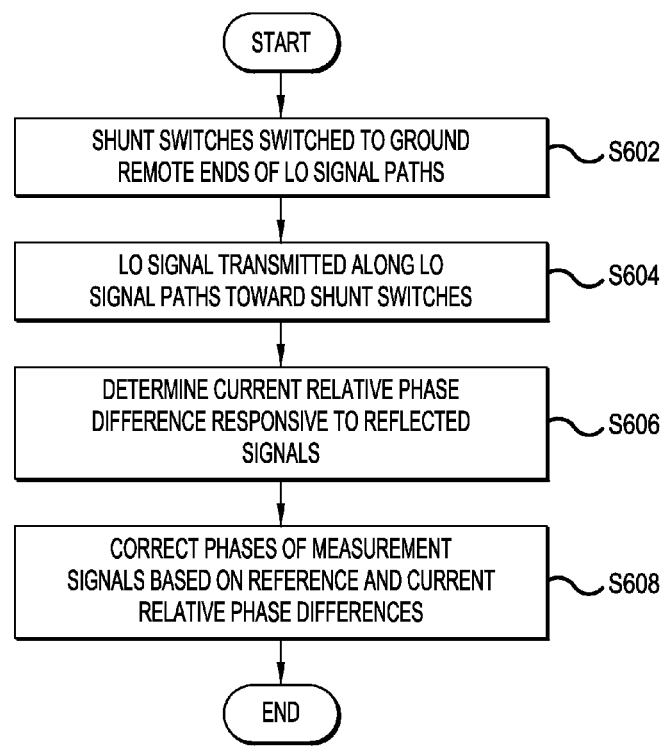
FIG. 6 illustrates a flow chart detailing the compensating of step S512 of FIG. 5, according to an embodiment of the inventive concept.

FIG. 6 illustrates a flow chart detailing the compensating of step S512 of FIG. 5, according to an embodiment of the inventive concept.

Referring to FIGS. 2 and 6, after reflectometer heads 210 and 220 have been connected to the DUT for testing of the DUT, shunt switches 214 and 224 are switched in step S602 to the first configuration, to effectively ground the remote ends of the coaxial cables that respectively provide the LO signal paths from test ports 3 and 4 of VNA 100. That is, shunt switches 214 and 224 respectively insert reflections between reflectometer heads 210 and 220 and the remote ends of the coaxial cables (first and second transmission lines) that provide the LO signal paths.

In step S604, the LO signal (second signal) generated by LO source 150 is provided through the corresponding aforementioned reflectometers to test ports 3 and 4 and are transmitted along the respective coaxial cables that provide the LO signal paths (first and second transmission lines) toward the shunt switches 214 and 224 that have been switched in step S602 to the first configuration to effectively ground the remote ends of the coaxial cables. Shunt switches 214 and 224 thus respectively return a third reflected signal and a fourth reflected signal back to VNA 100 responsive to the transmitted LO signal (second signal).

In step S606, controller 180 of VNA 100 is configured to determine a first current phase of the third reflected signal provided from receiver 137, and also a second current phase of the fourth reflected signal provided from receiver 147. In particular, the third reflected signal from shunt switch 214 is provided via test port 3 through directional coupler 135 and attenuator 136 to receiver 137, and the fourth reflected signal is provided via test port 4 through directional coupler 145 and attenuator 146 to receiver 147. The third and fourth reflected signals are respectively down-converted by receivers 137 and 147, and the respective down-converted third and fourth reflected signals are provided to controller 180. Controller 180 may be configured to determine and subsequently store the first and second current phases in memory within controller 180 or memory separate from controller 180.

In step S608, controller 180 of VNA 100 is configured to correct the phase of measurement signals provided from the DUT during testing, based on the reference and current phases. Controller 180 may be configured to correct the phase of the reference IF signal and the test IF signal provided by reflectometer head 210 based on the first reference phase and the first current phase, and to correct the phase of the reference IF signal and the test IF signal provided by reflectometer head 220 based on the second reference phase and the second current phase. Controller 180 may correct the phase of the reference IF signal and the test IF signal provided from reflectometer head 210 based on a difference between the first reference phase and the first current phase, and may correct the phase of the reference IF signal and the test IF signal from reflectometer head 220 based on a difference between the second reference phase and the second current phase. For example, controller 180 may be configured to delay or advance the phase of the reference IF signal and/or the test IF signal returned from reflectometer head 210 during testing of the DUT based on the difference between the first reference phase and the first current phase, and to delay or advance the phase of the reference IF signal and/or the test IF signal returned from reflectometer head 220 during testing of the DUT based on the difference between the second reference phase and the second current phase. Controller 180 may be configured to determine the amount of phase delay or advance needed for correction using various algorithms and the first and second relative phases and the first and second current phases.

In some embodiments of the inventive concept, controller 180 may be configured to determine the first and second current phases in step S606 before the reference IF signals and test IF signals are acquired during testing of the DUT. In other embodiments of the inventive concept, controller 180 may be configured to determine the first and second current phases in step S606 after the reference IF signals and test IF signals are acquired during testing of the DUT. Controller 180 may be configured to determine S-parameters responsive to the measurement signals returned from the DUT to VNA 100 during testing while the shunt switches 214 and 224 are in the second configuration.

Due to multiple reflections in the coaxial cables (first and second transmission lines) that provide the LO signal paths to reflectometer heads 210 and 220, especially when shunt switches 214 and 224 are switched in the first configuration to ground the remote ends of the respective coaxial cables, the phase change induced on signals transmitted along the coaxial cables that provide the LO signal paths (that is, the difference between the reference phase and the current phase) may not be accurately measured at a single frequency alone. In particular, the measured phase change induced on the signals in the coaxial cables will be the result of more than just the propagation of the LO signal back and forth once. Since the phase change induced on the LO signals in the coaxial cables is caused by cable movement which results in a physical length change of the coaxial cables, the amount of phase change is proportional to the frequency of the LO signals, as should be understood in view of FIG. 1. In some embodiments of the inventive concept, by assuming a pure proportionality between frequency and phase change, the phase change (that is, the difference between the reference phase and the current phase) may be measured at several frequencies and a proportionality factor may be derived by averaging. Also, well known curve fitting and smoothing functions may be used on the measured phase change to eliminate ripples in the measured phase change. The effects of multiple reflections may thus be averaged out and an exact phase correction factor for all frequencies may be obtained.

In other embodiments of the inventive concept, instead of shunt switches 214 and 224 such as shown in FIG. 2, a full set of electronic calibration standards (calpods) may be implemented at the remote ends of the coaxial cables that provide the LO signal and reflectometer heads 210 and 220. The calpods may be configured to selectively reflect and pass the LO signal. The use of such a full set of electronic calibration standards would enable measurement of the exact phase change for each single frequency point.

Figure 7:
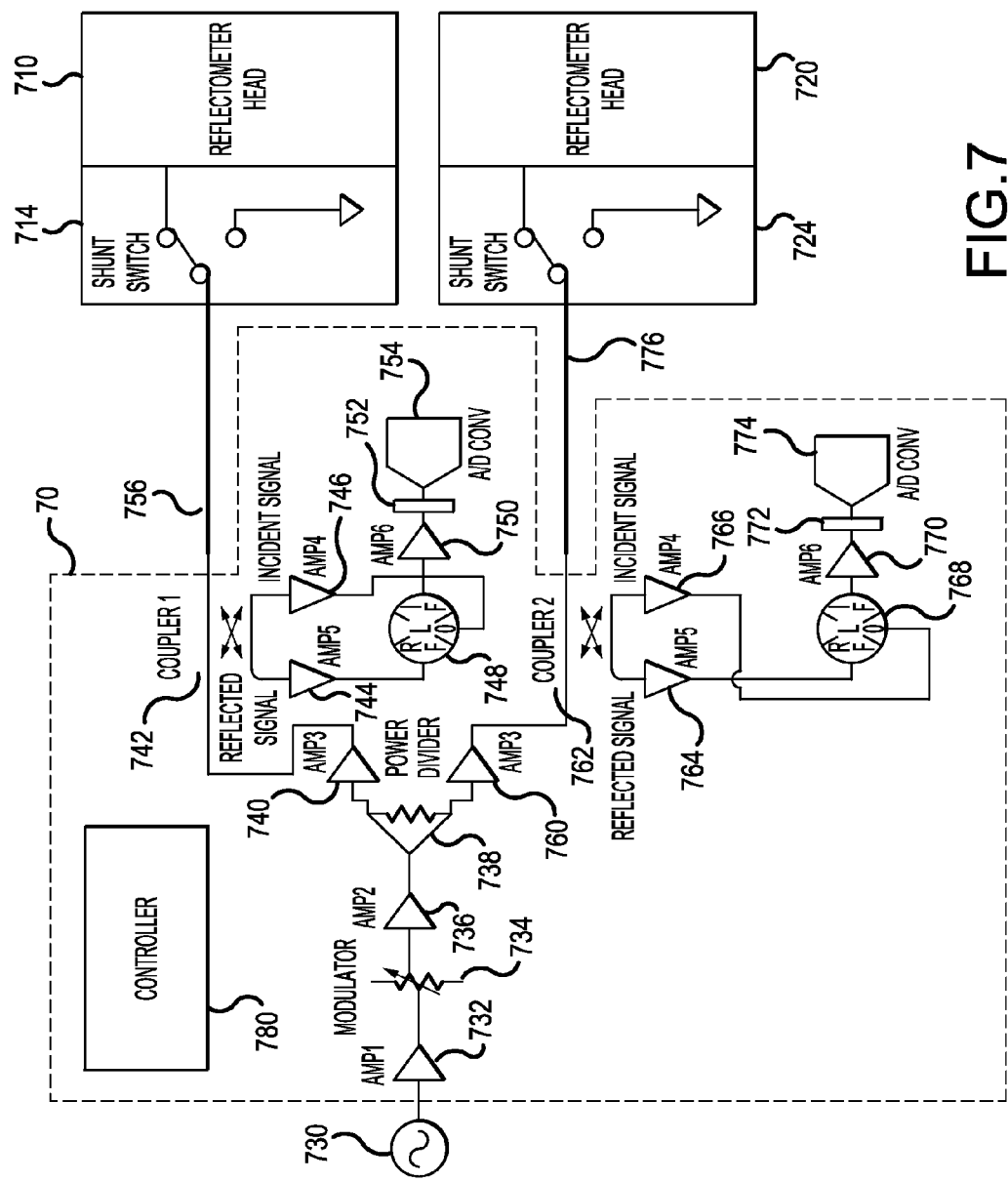
FIG. 7 illustrates a block diagram of a test set including homodyne mixers that measures phase change induced on signals transmitted over transmission lines connected to remote millimeter (mmw) reflectometer heads, according to an embodiment of the inventive concept.

FIG. 7 illustrates a block diagram of a test set 70 including homodyne mixers 748 and 768, that measures phase change induced on signals transmitted over transmission lines connected to remote millimeter (mmw) reflectometer heads 710 and 720, according to an embodiment of the inventive concept.

Referring to FIG. 7, test set 70 is disposed between LO source 730 and coaxial cables (first and second transmission lines) 756 and 776 that respectively provide LO signal paths for transmitting LO signals to reflectometer heads 710 and 720. Shunt switch 714 (first shunt switch) is connected between reflectometer head 710 (first remote head) and a remote end of the corresponding coaxial cable (first transmission line) 756 which provides an LO signal path from test set 70. Shunt switch 724 (second shunt switch) is connected between reflectometer head 720 (second remote head) and a remote end of the corresponding coaxial cable (second transmission line) 776 which provides an LO signal path from test set 70. Shunt switches 714 and 724 may be configured and function similarly as shunt switches 214 and 224 shown and described with respect to FIG. 2 and as further detailed in FIGS. 3 and 4. As shown in FIG. 7, shunt switches 714 and 724 are disposed at the respective ends of the corresponding coaxial cables externally of the reflectometer heads 710 and 720. In some embodiments of the inventive concept, shunt switches 714 and 724 may be disposed within respective reflectometer heads 710 and 720. Also, reflectometer heads 710 and 720 may be configured and function similarly as reflectometer heads 210 and 220 shown and described with respect to FIG. 2. Further detailed description of shunt switches 714 and 724 and reflectometer heads 710 and 720 is thus omitted.

LO source 730 generates and provides the LO signal to test set 70. LO source 730 is configured to output a millimeter wave signal within a frequency range of about 30 GHz to 1 THz. In some embodiments of the inventive concept, LO source 730 may be disposed within a VNA such as a 2-port VNA that is not configured or capable of measuring a return LO signal, but that distributes the LO signal to various reflectometer heads. Test set 70 may be located remotely from the 2-port VNA and may be configured to provide the corresponding measurement capability. In other embodiments of the inventive concept, LO source 730 may be provided separate from a VNA. It should be understood that the above noted frequency range of LO source 730 is an example, and that in other embodiments of the inventive concept various different frequency ranges may be used.

As further shown in FIG. 7, the LO signal from LO source 730 as provided to test set 70 is amplified by amplifier 732, thereafter modulated by modulator 734 and again amplified at amplifier 736 before being branched by power divider 738 into a first branched LO signal that is output to amplifier 740 and a second branched LO signal that is output to amplifier 760. The LO signal output from amplifier 740 is input to dual directional coupler 742 where a portion of the LO signal is branched off and provided to amplifier 746 as an amplified incident signal, and where a remaining portion of the LO signal is passed through and transmitted along coaxial cable 756 which provides an LO signal path to reflectometer head 710. In the first configuration, shunt switch 714 is switchable to effectively ground the remote end of coaxial cable 756 and reflect the LO signal transmitted along coaxial cable 756 back to test set 70 as a reflected signal. A portion of the reflected signal is branched off by dual directional coupler 742 and provided to amplifier 744. In the second configuration as specifically shown in FIG. 7, shunt switch 714 is switchable to pass the LO signal to reflectometer head 710 during testing of the DUT.

The amplified incident signal output from amplifier 746 is provided to the LO input of first mixer 748 (first phase detector), and the amplified reflected signal output from amplifier 744 is provided to the RF input of first mixer 748. First mixer 748 mixes the amplified reflected signal and the amplified incident signal to provide a down-converted IF signal that exhibits a DC voltage characteristic having an amplitude proportional to a phase difference between the amplified reflected signal and the amplified incident signal. The IF signal output from first mixer 748 is provided to amplifier 750, and the output of amplifier 750 is provided to low pass filter 752 which attenuates all higher order products. The output of low pass filter 752 is provided to A/D converter 754, which provides a digital output signal indicative of the phase difference between the amplified reflected signal returned from coaxial cable 756 and the amplified incident signal fed to coaxial cable 756.

Similarly as described above, the LO signal output from amplifier 760 is input to dual directional coupler 762 where a portion of the LO signal is branched off and provided to amplifier 766 as an amplified incident signal, and where a remaining portion of the LO signal is passed through and transmitted along coaxial cable 776 which provides an LO signal path to reflectometer head 720. In the first configuration, shunt switch 724 is switchable to effectively ground the remote end of coaxial cable 776 and reflect the LO signal transmitted along coaxial cable 776 back to test set 70 as a reflected signal. A portion of the reflected signal is branched off by dual directional coupler 762 and provided to amplifier 764. In the second configuration as specifically shown in FIG. 7, shunt switch 724 is switchable to pass the LO signal to reflectometer head 720.

The amplified incident signal output from amplifier 766 is provided to the LO input of second mixer 768 (second phase detector), and the amplified reflected signal output from amplifier 764 is provided to the RF input of second mixer 768. Second mixer 768 mixes the amplified reflected signal and the amplified incident signal to provide a down-converted IF signal that exhibits a DC voltage characteristic having an amplitude proportional to a phase difference between the amplified reflected signal and the amplified incident signal. The IF signal output from second mixer 768 is provided to amplifier 770, and the output of amplifier 770 is provided to low pass filter 772 which attenuates all higher order products. The output of low pass filter 772 is provided to A/D converter 774, which provides a digital output signal indicative of the phase difference between the amplified reflected signal returned from coaxial cable 776 and the amplified incident signal fed to coaxial cable 776.

As shown in FIG. 7, test set 70 further includes controller 780. Similarly as controller 180 described above with respect to FIG. 2, controller 780 is connected to various components and circuits within test set 70 via interconnections (not shown) that are internal to the test set. Controller 780 may be configured to be responsive to user selection, software, firmware or any combination thereof to generate various control and switching signals that control the various components and circuits within test set 70, and may perform various process operations. Controller 780 may be constructed of any combination of hardware, firmware or software architectures. Controller 780 may be implemented by an ASIC or part of an ASIC, or by an FPGA or part of an FPGA, and may include its own memory. The memory may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, and the like.

Although not specifically shown in FIG. 7, respective coaxial cables connected to reflectometer head 710 provide test IF, reference IF and RF signal paths between reflectometer head 710 and a VNA (not shown). The coaxial cables may be routed through test set 70, or may be disposed separately without running through test set 70. Also, controller 780 may provide a switching signal to control switching of shunt switch 714 into the first and second configurations. The switching signal may be output to shunt switch 714 from test set 70 via a respective wire, cable or signal path (not shown). Similarly, respective coaxial cables (not shown) connected to reflectometer head 720 provide test IF, reference IF and RF signal paths between reflectometer head 720 and a VNA (not shown). Also, a switching signal may be output from controller 780 to shunt switch 724 via a respective wire, cable or signal path (not shown) disposed between test set 70 and shunt switch 724.

A phase correction routine for cable phase correction is hereinafter described with reference to FIG. 7. Initially, before connecting reflectometer heads 710 and 720 to the DUT, shunt switches 714 and 724 are switched to the second configuration in the through path position to deliver the LO signals from respective coaxial cables 756 and 776 to reflectometer heads 710 and 720. A two/multiport port calibration of test set 70 is performed using calibration standards (such as previously described) connected to reflectometer heads 710 and 720. Controller 780 is configured to control the calibration and switching of shunt switches 714 and 724.

After the two/multiport port calibration, shunt switches 714 and 724 are switched to the first configuration, and an LO signal (first signal) is provided through power divider 738 and amplifiers 740 and 760 to be respectively transmitted along coaxial cable 756 (first transmission line) and coaxial cable 776 (second transmission line). In the first configuration, shunt switches 714 and 724 effectively terminate the remote ends of respective coaxial cables 756 and 776 to ground, causing total or very close to total reflection of the LO signal (first signal) back through the coaxial cables 756 and 776 as respective first and second reflected signals to dual directional couplers 742 and 762. That is, shunt switches 714 and 724 respectively insert reflections between the remote ends of coaxial cables 756 and 776 and reflectometer heads 710 and 720. The dual directional couplers 742 and 762 respectively couple portions of the first and second reflected signals to amplifiers 744 and 764. The outputs of amplifiers 744 and 764 are respectively provided to the RF ports of first and second mixers 748 and 768, which function as homodyne mixers.

The portions of the LO signals (incident signals) driving the LO ports of first and second mixers 748 and 768 are hereinafter referred to as reference signals V1 and may be defined as:

$$V1 = v1 * \cos(\omega t)$$

wherein $\omega = 2\pi f$ and f is the LO signal frequency.

The signals driving the RF ports of first and second mixers 748 and 768 are hereinafter referred to as the reflected signals V2. The reflected signals V2 are the portions of the incident LO signals that have traveled through the respective coaxial cables 756 and 776 to first and second shunt switches 714 and 724, and which are reflected back to dual directional couplers 742 and 762. The respective portions of the reflected LO signals provided through the dual directional couplers 742 and 762 and further amplified by amplifiers 744 and 746, which drive the RF ports of first and second mixers 748 and 768, may be represented by $$V2 = v2 * \cos(\omega t + \beta + 2KL) \tag{2},$$

wherein $\beta$ is the accumulated phase delay between V1 and V2, excluding the phase delay which results as the LO signals travel through the coaxial cables 756 and 776 and back. The LO cable delay may be represented by KL, where KL is the delay of the LO signal traveling the single length of the corresponding coaxial cable. Therefore, 2KL corresponds to the phase delay resulting from the LO signal traveling to the end of the corresponding coaxial cable and back, where K is the wave number which may be defined as $K = 2\pi/\lambda$, $\lambda$ is the wavelength of the LO signal which may be defined as $\lambda = V/f$, and V is the velocity of electromagnetic waves inside the corresponding coaxial cable. The LO signal is swept through its full frequency band during the LO phase correction routine.

The signals V1 and V2 drive the first and second mixers 748 and 768 in the homodyne state. As described previously, first and second mixers 748 and 768 function as phase detectors. In some embodiments of the inventive concept, a microwave phase detector IC such as an XOR component, or any component that can function as microwave phase frequency detector may be used instead of first and second mixers 748 and 768. The corresponding IF outputs from first and second mixers 748 and 768 may be defined as:

$$V3 = V1*V2 = (v1*\cos(\omega t))*(v2*\cos(\omega t+\beta+2KL)) = \tfrac{1}{2}*v1*v2(\cos(2\omega t+\beta+2KL)+\cos(\beta+2KL)) \tag{3}.$$

The IF outputs from first and second mixers 748 and 768 are respectively provided to low pass filters 752 and 772 which attenuate all higher order products (e.g. $\cos(2\omega t+\beta+2KL)$) leaving just the signals of interest:

$$V4 = \tfrac{1}{2}*v1*v2\cos(\beta+2KL) \tag{4},$$

which are detected by respective A/D converters 754 and 774. The outputs of A/D converter 754 (first phase difference signal of the LO coaxial cable 756) and A/D converter 774 (second phase difference signal of the LO coaxial cable 776) as previously described are respectively indicative of the phase differences between the respective reflected signal returned from the corresponding coaxial cable and the LO signal fed to the corresponding coaxial cable. Controller 780 is configured to detect the zero crossings of the output of A/D converter 754 as a first reference phase (of LO coaxial cable 756) and the zero crossings of the output of A/D converter 774 as a second reference phase (of LO coaxial cable 776). The outputs of A/D converters 754 and 774 are measured phase over frequency which is correlated to the effective length of the coaxial cable versus frequency, to yield the respective physical length of the coaxial cables 756 and 776.

In detail, the phase shift at every zero crossing of the output of A/D converter 754 is indicative of 90 degrees (or multiples thereof) of phase difference between the part of incident signal coupled through the dual directional coupler 742 (the aforementioned V1) and the reflected signal that traveled through coaxial cable 756 to first shunt switch 714 and back (the aforementioned V2), The adjacent zero crossings, corresponding to the frequency zero crossings are the adjacent 90 degrees phase shifts between the incident and reflected signals and the phase difference between the adjacent phases are 180 degrees (i.e., the difference in phase between 90 and 270 degrees) and may be derived by controller 780 as follows:

$$2L*(K2-K1) = \pi \tag{5},$$

$$2L*[(2\pi/\lambda 2)-(2\pi/\lambda 1)] = \pi \tag{6},$$

$$2L*[(2\pi*f2/V)-(2\pi*f1/V)] = \pi \tag{7},$$

$$4L(f2-f1)/V = 1 \tag{8},$$

and $$\Delta f = f2 - f1 = V/4L \tag{9},$$

wherein f2 and f1 are the frequencies and wherein λ2 and λ1 are the wavelengths of the adjacent zero crossings points. The phase shift at every zero crossing of the output of A/D converter 774 is indicative of 180 degrees of phase difference between the part of incident signal coupled through the dual directional coupler 762 and the reflected signal that traveled through coaxial cable 776 to first shunt switch 724 and back, and may be similarly derived by controller 780.

Figure 8A:
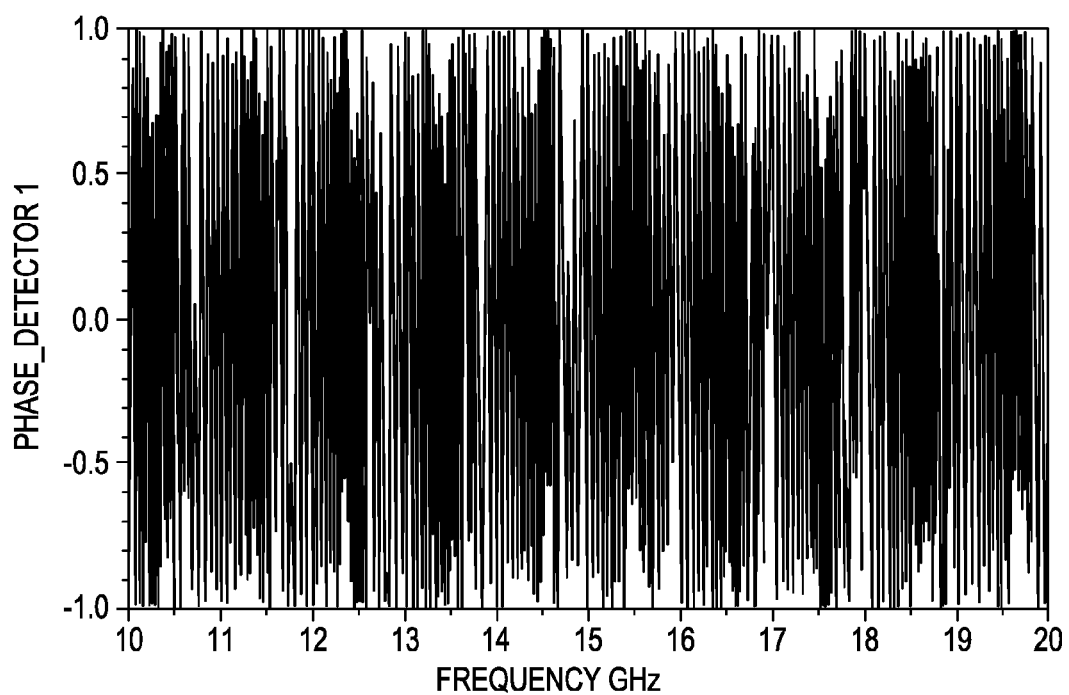
FIG. 8A illustrates a graph of a sinusoidal signal as generated by the test set and that represents phase difference, according to an embodiment of the inventive concept.
Figure 8B:
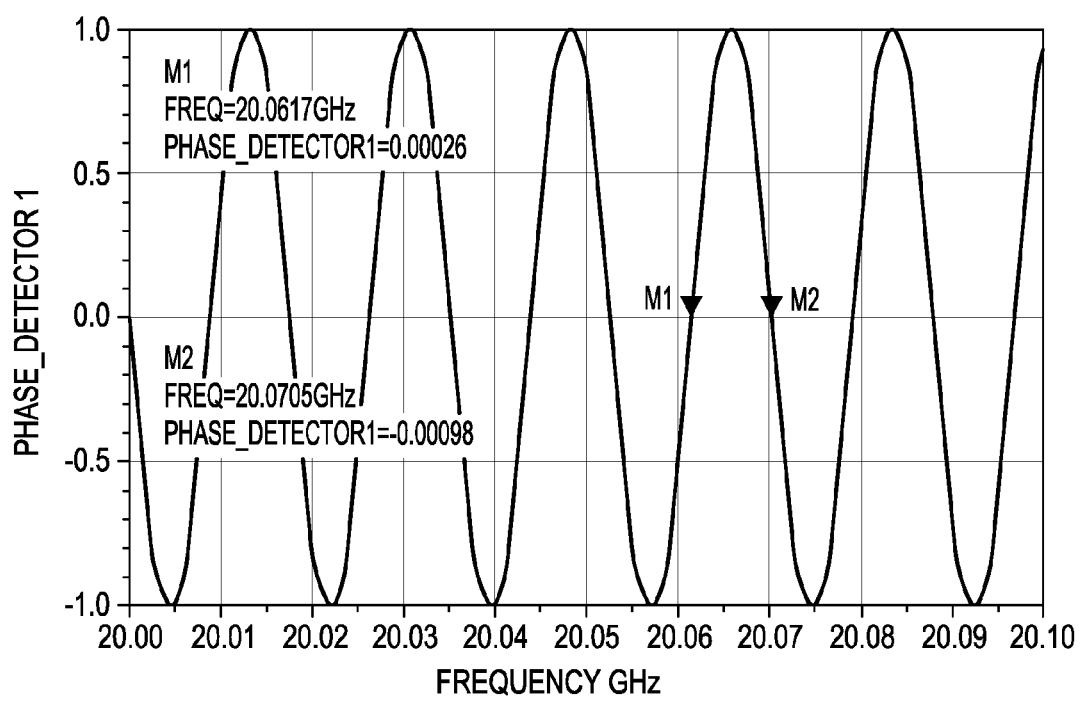
FIG. 8B illustrates a graph of a zoomed-in version of the sinusoidal signal shown in FIG. 8A.

FIG. 8A illustrates a graph of a dense sinusoidal signal representing phase difference as generated by test set 70, according to an embodiment of the inventive concept. In this case, FIG. 8A illustrates the first phase difference signal as output from A/D converter 754 responsive to the first signal. The second phase difference signal as output from A/D converter 774 would appear similarly and the following description would correspondingly apply to the second phase difference signal as well. A one meter length coaxial cable 756 was disposed between test set 70 and first shunt switch 714/reflectometer head 710. FIG. 8B illustrates a graph of a zoomed-in version of the sinusoidal signal shown in FIG. 8A.

Since it would be difficult to decipher the frequency response of the output of A/D converter 754 versus the LO signal frequency due to lack of resolution, the zoomed-in simulation of the dense sinusoidal signal shown in FIG. 8B is here considered. The signal as shown in FIG. 8B is responsive to the LO signal (first signal) from LO source 730 sweeping from 20 GHz to 20.1 GHz, and has half period equal to 180 degrees of phase shift equal to consecutive zero crossings of the output of A/D converter 754 in the frequency domain. The frequency difference between two zero crossings markers m1 and m2 as shown in FIG. 8B is determined by controller 780 as 20.0705-20.0617=0.0088 GHz. As previously described, the zero crossings correspond to 180 degrees of phase difference between the reflected and incident LO signals provided from dual directional coupler 742 to drive first mixer 748. Using the signal velocity in coaxial cable 756 which is known, the length of coaxial cable 756 may be calculated by controller 780 from the measured frequency difference (0.0088 GHz) using equation (9).

Figure 8C:
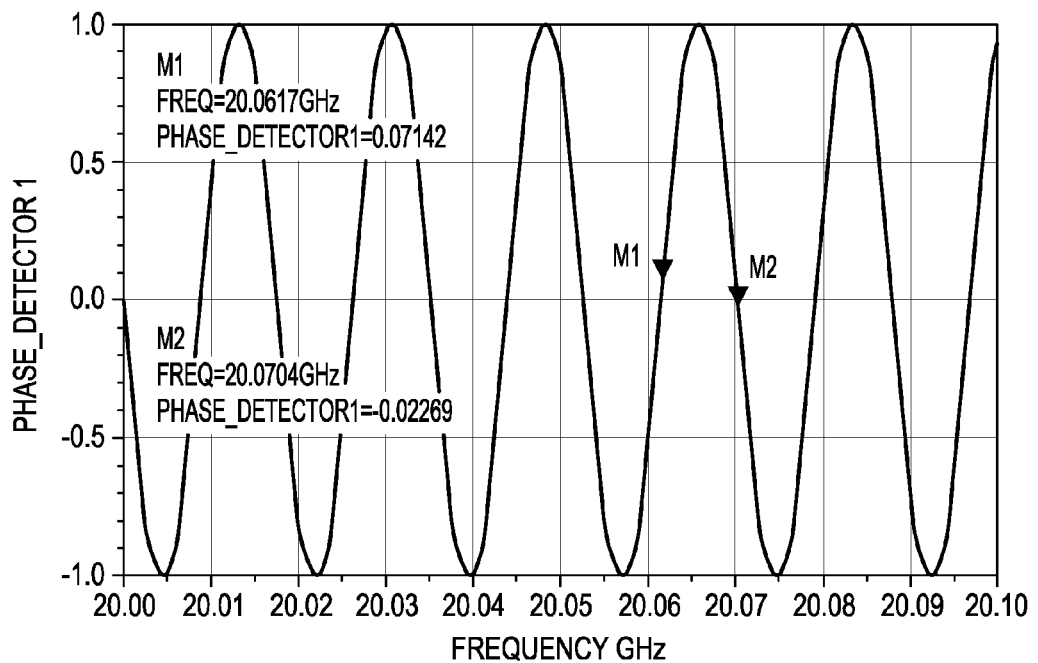
FIG. 8C illustrates a graph showing a shift in zero crossing frequency of the sinusoidal signal representing phase difference, according to an embodiment of the inventive concept.

FIG. 8C illustrates a graph showing a shift in the zero crossing frequency of the sinusoidal signal representing phase difference, according to an embodiment of the inventive concept. The shift in zero crossing frequency may occur as a result of movement of coaxial cables 756 and 776. In particular, after the reflectometer heads 710 and 720 are connected to the DUT (not shown), shunt switches 714 and 724 are switched to the first configuration to respectively insert reflections (first reflection and second reflection) between the remote ends of the coaxial cables 756 and 776 and reflectometer heads 710 and 720. LO source 730 provides an LO signal (second signal) through power divider 738 and amplifiers 740 and 760 that is respectively transmitted along coaxial cables 756 and 776. The transmitted LO signal (second signal) is reflected back to dual directional couplers 742 and 762 by respective shunt switches 714 and 724 as third and fourth reflected signals. The third and fourth reflected signals are respectively provided to first and second mixers 748 and 768 via amplifiers 744 and 764. Similarly as described above, first mixer 748 mixes the amplified reflected signal and the amplified incident signal as provided from amplifiers 744 and 746 thereto responsive to the LO signal (second signal) as transmitted along coaxial cable 756, to provide a down-converted IF signal (third phase difference signal) that exhibits a DC voltage characteristic having an amplitude proportional to a phase difference between the corresponding amplified reflected and incident signals. Second mixer 768 similarly provides a down-converted IF signal (fourth phase difference signal) that exhibits a DC voltage characteristic proportional to a phase difference between the amplified reflected signal and the amplified incident signal as provided from amplifiers 764 and 766 responsive to the LO signal (second signal) transmitted along coaxial cable 776. The third and fourth phase difference signals are provided to controller 780.

Controller 780 is configured to detect the zero crossings of the output of A/D converter 754 responsive to the LO signal (second signal) as a first current phase, and the zero crossings of the output of A/D converter 774 responsive to the LO signal (second signal) as a second current phase. For example, the zero crossing frequency of the third phase difference signal output of A/D converter 754 of test set 70 (shown in FIG. 8C) is shifted with respect to the zero crossings of the first phase difference signal output from A/D converter due to the phase change in coaxial cable 756 caused by cable movement. Here, marker m1 is left at its original frequency point of 20.0617 GHz and marker m2 is moved to the corresponding new frequency zero crossing at 20.0704 GHz, to indicate the shift in frequency of the zero crossings. Therefore, the frequency shift that corresponds to the cable phase shift due to movement at marker m2 is determined by controller 780 as 20.0704 GHz-20.0705 GHz=-0.0001 GHz. This translates to a phase shift of (180*-0.0001)/0.0088=-2.04 degrees, and enables accurate estimation of the phase change caused by the movement of coaxial cable 756 by controller 780.

Controller 780 shown in FIG. 7 is configured to transmit a signal indicative of the estimated phase change in coaxial cable 756 and a signal indicative of the estimated phase change in coaxial cable 776 determined as described above to the VNA (not shown) via respective wires, cables or signal paths (not shown). The VNA may include a phase compensator (phase compensation unit) and may compensate the phase of measurement signals obtained during testing of the DUT based on the transmitted signals indicative of estimated phase change. In particular, the VNA may correct the phase of reference IF and test IF signals provided by reflectometer head 710 based on the estimated phase change determined by controller 780 responsive to the first and third phase difference signals, and may correct the phase of reference IF and test IF signals provided by reflectometer head 720 based on the estimated phase change determined by controller 780 responsive to the second and fourth phase difference signals.

Figure 9A:
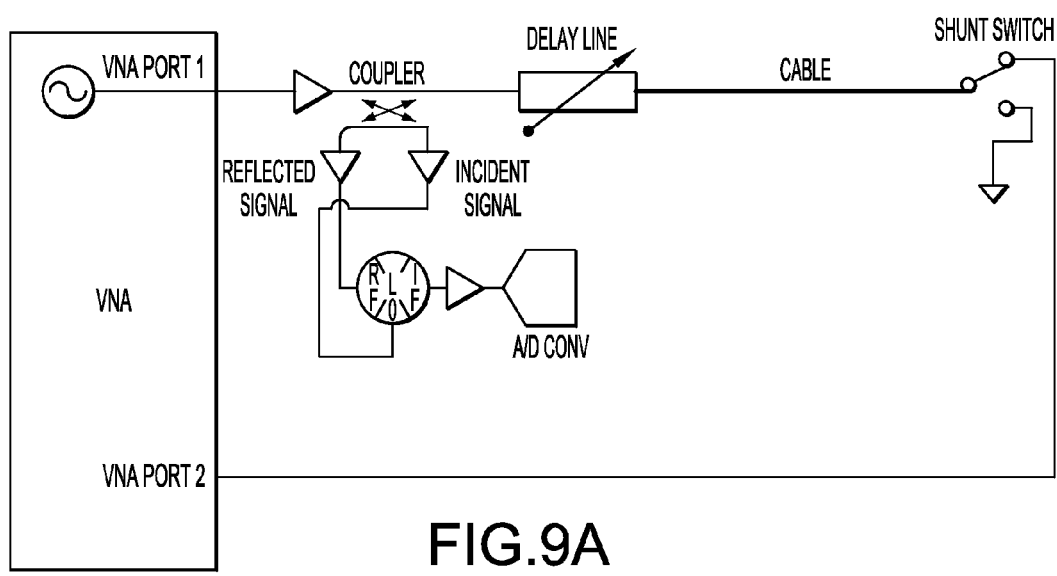
FIG. 9A illustrates a block diagram of an experimental set-up, according to an embodiment of the inventive concept.
Figure 9B:
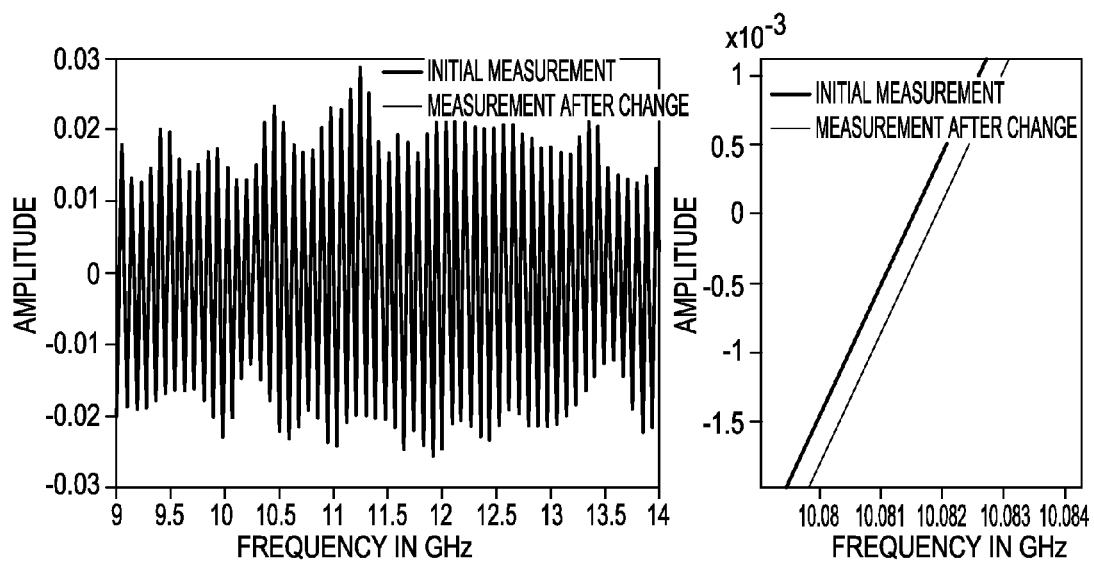
FIGS. 9B, 9C and 9D illustrate graphs descriptive of the experimental set-up shown in FIG. 9A.
Figure 9C:
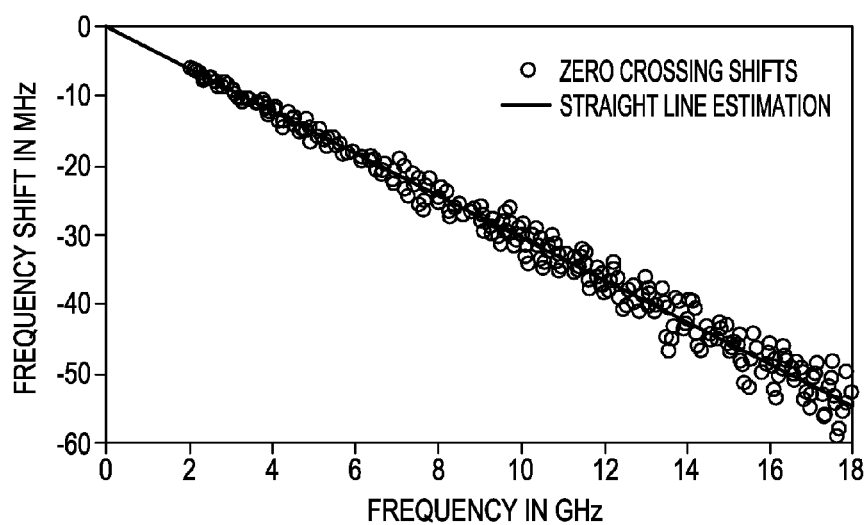
Figure 9D:
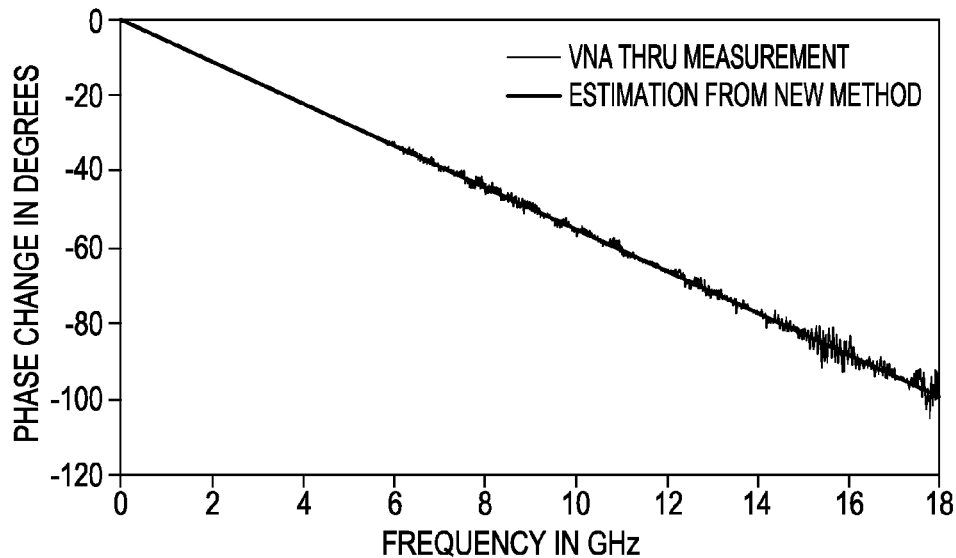

An experimental set-up that was used to confirm accuracy of the phase estimation is shown in FIG. 9A. The Port 1 of the VNA was connected via an amplifier, a coupler, a delay line, a long RF cable and a shunt switch to Port 2 of the VNA. The delay line was used to mimic a predictable, stable and repeatable phase shift of the cable movement. Connecting the output of the shunt switch to the Port 2 of the VNA enabled the measurement of delay line phase shift (S21 phase) and comparison of the S21 phase shift with the mixer based phase frequency detector. FIG. 9B shows the amplitude at the mixer output over frequency. In the zoomed excerpt on the right, it can be seen that the zero crossing of the curve shifted when moving the delay which replaces the cable movement. In FIG. 9C the measured frequency shifts of the zero crossings over the whole frequency range are shown. Based on the assumption of perfect proportionality between phase shift and frequency, a simple straight line was derived from the measurements as shown in FIG. 9C. This straight line directly corresponds to a cable length change which can be transferred into the phase change. The cable length changes may be very minute and may be caused by compression or stretching, which causes changes in the cable dielectric constant of the cable and which resultantly changes the impedance of the cable at the point of stress, further causing phase shift of the signal transmitted through the cable. As shown in FIG. 9D, this estimation fits very well to the S21 phase change measured with the switch in the experimental set of FIG. 9A in the thru mode.

Figure 10A:
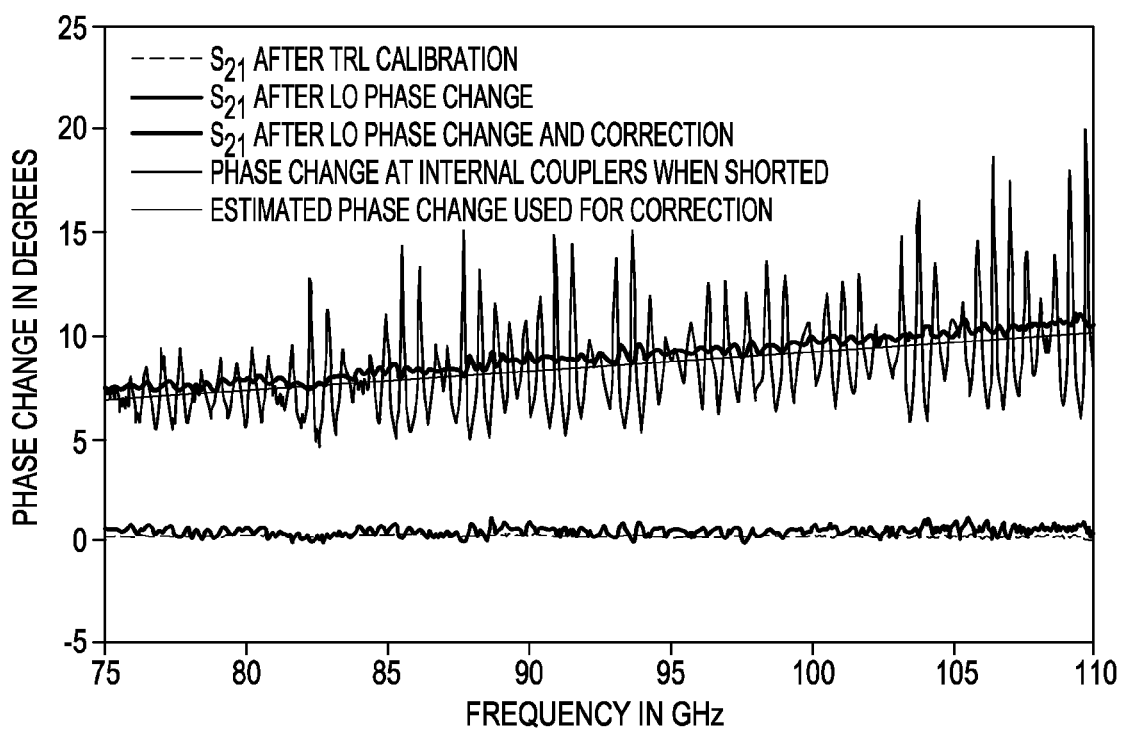
FIGS. 10A and 10B illustrates graphs indicative of the performance of phase correction of additional experimental set-ups.

In two additional experimental set-ups, the overall system was implemented based on the shunt switches at the ends of the LO cables. The performance of the phase correction based on using the integrated reflectometers of a 4-port VNA is shown in FIG. 10A. The experimental set-up in this case used the internal couplers of a 4-port VNA such as shown in the system described with respect to FIG. 2. The experimental set-up used the internal mixers of the VNA to determine the phase change between the reference LO signal transmitted to the reflectometer heads and the reflected LO signal returned by the reflectometer heads. First, the reflectometer heads were calibrated, followed by connecting the reflectometer heads together to each other and an S21 phase was measured and stored as a reference phase ($S_{21}$ After TRL Calibration in FIG. 10A). This was followed by inserting an electronic short at the ends of LO cables, causing a total refection of the incident signal, where the phase difference between the incident and reflected signals was measured and stored as the LO reference phase. The LO cable phase was further shifted via an inline mechanical phase shifter (this was used to realize a stable phase shift versus bending of the cable) in one of the LO cables (i.e., test port 1) ($S_{21}$ After LO Phase Change in FIG. 10A). The $S_{21}$ phase of the connected reflectometer heads was measured and the difference between the reference phase and new phase was calculated and the correction was applied to the measurement ($S_{21}$ After LO Phase Change And Correction in FIG. 10A), to set the baseline phase correction to check the accuracy of the phase correction scheme. Further, an RF short was applied at the end of the LO cables and the phase difference between the incident and reflected LO signals was measured (Phase Change At Internal Couplers When Shorted in FIG. 10A) using the couplers within the VNA, via the heterodyne receivers within the VNA (this was after implementing the above noted mechanical phase shift). The difference between the reference phase and the phase after delay represents the phase error, which was smoothed and used as the Estimated Phase Change For Correction as shown in FIG. 10A. As may be appreciated in view of FIG. 10A, the LO phase correction and direct phase shift measurement via the S21 measurement were shown to be in a good agreement.

Figure 10B:
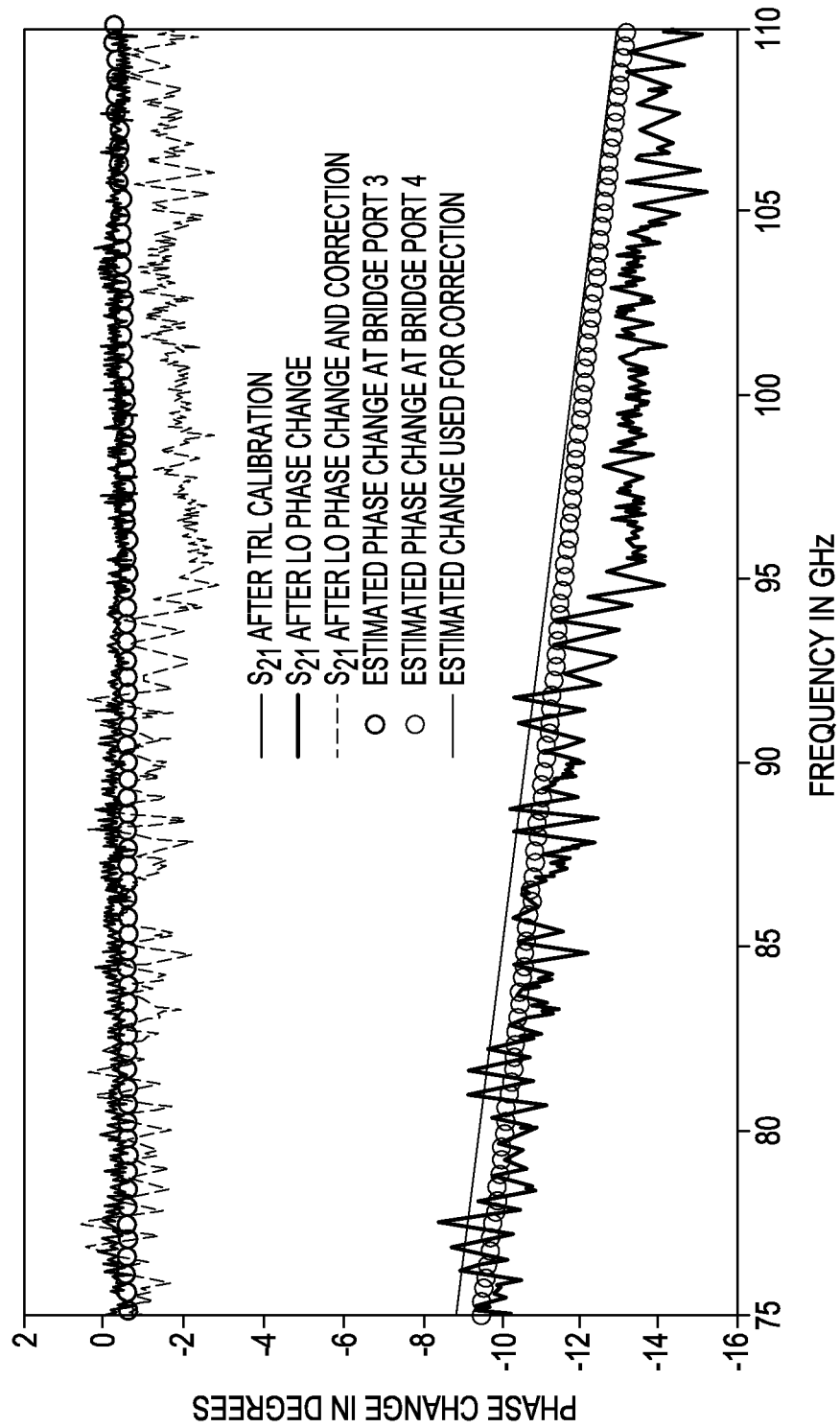

FIG. 10B shows the performance of the system based on the homodyne mixers such as shown in FIG. 7. The experimental set-up follows the same routine as described above with respect to FIG. 10A. The difference is that the external highly directive couplers (or low loss and high directivity bridge ports) as shown in FIG. 7 were used to separate the incident signals and the reflected signals. Port 3 of the LO path is the cable connected through a mechanical phase shifter to first remote head and port 4 is the LO cable that is connected to the second remote head without going through a mechanical phase shifter. Since the cable connected to port 4 was kept in a static position and does not have inline phase shifter, the phase change is a straight line at zero phase as shown in FIG. 10B. The estimated phase change at port 3 that corresponds to the phase difference between the initial reference phase measurement using the homodyne mixer, having the zero crossings output that corresponds to specific LO frequencies where the reference and reflected signals are at 90 degrees or multiple of 90 degrees, corresponding to the phase difference between reference and reflected signals and the phase shifts correspond to LO frequencies zero crossing of homodyne mixer after the phase shift specifically set by the phase shifter. The incident signal was used as the LO signal for the homodyne mixer. Mixing the reflected signal with the incident signal resulted in a sine wave like output as LO source 730 was swept through its frequency range. The corresponding zero crossings constitute 180 degrees phase difference between incident and reflected signals, and the shift of the zero crossings as the LO source 730 was swept constitutes twice the phase shift caused by delay line. The experimental set-up described with respect to FIG. 10B confirmed accurate estimation of phase change. In particular, FIG. 10B represents homodyne detection of the phase shift caused by the tuning of the mechanical phase shifter at port 3 via the measurement of the change of $S_{21}$ phase of the remote heads connected together before changing the phase via the mechanical phase shifter and keeping the LO cable at port 4 in a static position and comparing it to the phase shift measured via homodyne mixers at port 3 and port 4. Port 4 does not show any phase shift due to static condition of the LO cable, but port 3 exhibits phase shift after the mechanical phase shifter has been moved. The $S_{21}$ phase shift measurement via direct connection of the remote heads is in an agreement with the homodyne cable phase correction.

While representative embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the representative embodiments described herein. More generally, those skilled in the art will readily appreciate that all parameters and configurations described herein are meant to be exemplary and that the actual parameters and/or configurations will depend upon the specific application or applications for which the teachings is/are used. Those skilled in the art will recognize, or be able to ascertain using no more than routine experimentation, many equivalents to the specific representative embodiments described herein. It is, therefore, to be understood that the foregoing embodiments are presented by way of example only and that, within the scope of the appended claims and equivalents thereto, representative embodiments may be practiced otherwise than as specifically described and claimed. In addition, any combination of two or more such features and/or methods, if such features and/or methods are not mutually inconsistent, is included within the inventive scope of the present disclosure.

The phrase "and/or," as used herein in the specification and in the claims, should be understood to mean "either or both" of the elements so conjoined. In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A system comprising:
   a phase measurement apparatus configured to transmit a first signal along first and second transmission lines to respective first and second remote heads connectable to a device;
   a first shunt switch connected between a remote end of the first transmission line and the first remote head;
   a second shunt switch connected between a remote end of the second transmission line and the second remote head,
   wherein the first and second shunt switches respectively reflect the first signal back to the phase measurement apparatus as first and second reflected signals in a first configuration, and pass the first signal to the first and second remote heads in a second configuration during testing of the device, and
   wherein the phase measurement apparatus is further configured to determine a first reference phase based on the first reflected signal and a second reference phase based on the second reflected signal; and
   a phase compensation unit configured to compensate phase of measurement signals obtained during testing of the device based on the first and second reference phases.

2. The system of claim 1, wherein the phase measurement apparatus is further configured to transmit a second signal along the first and second transmission lines after connection of the first and second remote heads to the device and with the first and second shunt switches in the first configuration,
   wherein the first and second shunt switches respectively reflect the second signal back to the phase measurement apparatus as third and fourth reflected signals, and
   wherein the phase measurement apparatus is further configured to determine a first current phase responsive to the third reflected signal and a second current phase responsive to the fourth reflected signal.

3. The system of claim 2, wherein the phase compensation unit is configured to correct the phase of the measurement signals based on to the first and second reference phases and the first and second current phases.

4. The system of claim 1, wherein the phase compensated measurement signals are used to determine S-parameters of the device.

5. The system of claim 1, wherein the phase measurement apparatus comprises:
   a first phase detector having the first signal and the first reflected signal input thereto, and configured to generate a first phase difference signal having an amplitude proportional to a phase difference between the first signal and the first reflected signal; and
   a second phase detector having the first signal and the second reflected signal input thereto, and configured to generate a second phase difference signal having an amplitude proportional to a phase difference between the first signal and the second reflected signal.

6. The system of claim 5, wherein the phase measurement apparatus is configured to respectively determine the first reference phase and the second reference phase based on zero crossings of the first and second phase difference signals.

7. The system of claim 1, wherein the phase measurement apparatus is configured to sweep the first signal over a frequency range and determine the first and second reference phases at a plurality of frequencies within the frequency range, and the phase compensation unit is configured to derive a common phase correction factor usable on the measurement signals having frequencies within the frequency range, based on the first and second reference phases determined at the plurality of frequencies.

8. The system of claim 1, wherein the phase measurement apparatus is housed within a network analyzer and is configured to transmit a local oscillation signal generated by the network analyzer as the first signal.

9. The system of claim 1, wherein the phase measurement apparatus is housed within a test set and is configured to transmit a local oscillation signal received from a remote location as the first signal.

10. The system of claim 1, wherein the first and second shunt switches comprise:
    a capacitor having a first terminal connected to the remote end of a respective one of the first and second transmission lines;
    a diode having an anode connected to a first terminal of the capacitor and a cathode connected to ground; and
    an inductor having a first terminal connected to a switching signal and a second terminal connected to the anode of the diode.

11. The system of claim 1, wherein the first and second shunt switches comprise:
    a capacitor having a first terminal connected to the remote end of a respective one of the first and second transmission lines; and
    a field effect transistor having a first terminal connected to a second terminal of the capacitor, a second terminal connected to ground, and a gate terminal connected to a switching signal.

12. The system of claim 1, wherein the first and second transmission lines comprise flexible coaxial cables.

13. A method of correcting phase of measurement signals obtained from remote heads during testing of a device, the method comprising:
    inserting a first reflection between a remote end of a first transmission line and a first remote head, and a second reflection between a remote end of a second transmission line and a second remote head;
    transmitting a first signal along the first and second transmission lines toward the respective first and second reflections;
    determining a first reference phase and a second reference phase using a phase measurement apparatus, respectively based on a first reflected signal and a second reflected signal reflected by the first and second reflections responsive to the first signal; thereafter
    connecting the first and second remote heads to the device; and
    compensating phase of the measurement signals obtained during testing of the device based on the first and second reference phases.

14. The method of claim 13, wherein said compensating comprises:
    inserting the first reflection between the remote end of the first transmission line and the first remote head, and the second reflection between the remote end of the second transmission line and the second remote head;
    transmitting a second signal along the first and second transmission lines toward the respective first and second reflections; and
    determining a first current phase and a second current phase using the phase measurement apparatus respectively based on third and fourth reflected signals reflected by the first and second reflections responsive to the second signal.

15. The method of claim 14, wherein said compensating comprises correcting the phase of the measurement signals based on the first and second reference phases and the first and second current phases.

16. The method of claim 14, wherein the first and second signals comprise a local oscillator signal generated by a network analyzer.

17. The method of claim 13, further comprising determining S-parameters from the phase compensated measurement signals.

18. The method of claim 13, wherein the first signal is swept over a frequency range, and the first and second reference phases are determined at a plurality of frequencies within the frequency range, and wherein said compensating comprises deriving a common phase correction factor usable on the measurement signals having frequencies within the frequency range, based on the first and second reference phases determined at the plurality of frequencies.

19. The method of claim 13, wherein said determining comprises:

mixing the first signal and the first reflected signal to generate a first phase difference signal having an amplitude proportional to a phase difference between the first signal and the first reflected signal; and mixing the first signal and the second reflected signal to generate a second phase difference signal having an amplitude proportional to a phase difference between the first signal and the second reflected signal.

20. The method of claim 19, wherein the first reference phase and the second reference phase are respectively determined based on zero crossings of the first and second phase difference signals.

* * * * *